United States Patent [19]
Latta

[11] Patent Number: 5,385,291
[45] Date of Patent: Jan. 31, 1995

[54] METHOD EMPLOYING AN ELEVATING OF ATMOSPHERIC PRESSURE DURING THE HEATING AND/OR COOLING PHASES OF BALL GRID ARRAY (BGA) SOLDERING OF AN IC DEVICE TO A PCB

[75] Inventor: Richard W. Latta, Boise, Id.

[73] Assignee: Micron Custom Manufacturing Services, Inc., Boise, Id.

[21] Appl. No.: 179,396

[22] Filed: Jan. 10, 1994

[51] Int. Cl.$^6$ .............................................. H05K 3/34
[52] U.S. Cl. .................... 228/180.22; 228/246
[58] Field of Search ............ 228/180.22, 219, 246, 228/256, 262.9

[56] References Cited

U.S. PATENT DOCUMENTS

| | | | |
|---|---|---|---|
| 4,760,948 | 8/1988 | Spiecker | 228/180.22 |
| 4,878,611 | 11/1989 | LoVasco et al. | 228/180.22 |
| 4,914,814 | 4/1990 | Behun et al. | 228/180.22 |
| 5,222,014 | 6/1993 | Lin | 228/180.22 |

Primary Examiner—Samuel M. Heinrich
Attorney, Agent, or Firm—Michael W. Starkweather

[57] ABSTRACT

There is a method for increasing the life of the mechanical bonding between the PCB and the surface mount IC. Specifically, the invention elevates the atmospheric pressure during the heating and cooling phases of Ball Grid Array (BGA) soldering of an IC device to a PCB. This accomplishes a decreasing of the curvature of the solder ball wall inherent in the typical BGA technique. Uniquely, by increasing the atmospheric pressure around the solder ball during the cooling phases, specifically, the outer pressure will decrease the outer curvature of the walls. This allows the PCB and IC to increase the stand off distance, and increase the strength of the mechanical properties of the weld. With stronger bonding, the ICs will stay bonded longer to the PCB before deteriorating and thereby needing replacement.

4 Claims, 1 Drawing Sheet

METHOD EMPLOYING AN ELEVATING OF ATMOSPHERIC PRESSURE DURING THE HEATING AND/OR COOLING PHASES OF BALL GRID ARRAY (BGA) SOLDERING OF AN IC DEVICE TO A PCB

FIELD OF THE INVENTION

The present invention relates to integrated circuits (ICs). Particularly, there is a method of BGA soldering ICs to a printed circuit board. Uniquely, the elevated atmospheric pressure during soldering will change the typically short solder balls to potentially taller columns of solder. Therefore, allowing the advantage of mechanically mounting the ICs without having to be as close to the PCB to get solid solder connections.

BACKGROUND OF THE INVENTION

Soldering of ICs onto PCBs is a relatively old art by modern semiconductor time frames. However, there has been a recent development in presenting ICs to the component board assemblers, called Ball Grid Array, or BGA for short. This is where the individual IC, already has balls of solder placed at each contact to be welded to the PCB. The process of placing the ICs on the PCB involves a simple pressing force onto the IC to the PCB while heating. The heat melts the solder balls and thereby mechanically bonds the IC to the PCB. Thereafter, the IC is lifted up off of the PCB surface, known as the stand off distance, to create a better current path and mechanical weld. Currently, the maximum solder ball heights achieved during the lifting step are about 0.025 inches; any higher and the solder ball will disengage the bonded component.

Problems

One of the problems with BGA processes is that experimental results from other bonding techniques have shown that the less curvature in the ball side walls, the more reliable the solder connections would be mechanically. Specifically, the time to failure of the bonding will increase, i.e. the bond lasts longer. In an ideal condition, the solder ball would have vertical walls, much like a column. This design would provide for maximum conduction and minimum mechanical stresses that lead to bond cracking and fracturing. So far, no one has attempted to solve this problem with the relatively new BGA soldering technique. Therefore, a need exists for increasing the life of the mechanical bonding between the PCB and the surface mount IC. Specifically, by decreasing the curvature of the solder ball wall inherent in the typical BGA technique.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of elevating the atmospheric pressure during the heating and cooling phases of Ball Grid Array (BGA) soldering of an IC device to a PCB. Specifically, the invention is a method for increasing the life of the mechanical bonding between the PCB and the surface mount IC. This is accomplished by decreasing the curvature of the solder ball wall inherent in the typical BGA technique. Uniquely, by increasing the atmospheric pressure around the solder ball during the cooling phases, specifically, the outer pressure will decrease the outer curvature of the walls. This allows the PCB and IC to increase the stand off distance, and increase the strength of the mechanical properties of the weld. With stronger bonding, the ICs will stay bonded longer to the PCB before needing replacement.

Other features and advantages of the present invention may become more clear from the following detailed description of the invention, taken in conjunction with the accompanying drawings and claims, or may be learned by the practice of the invention.

Figure 1:
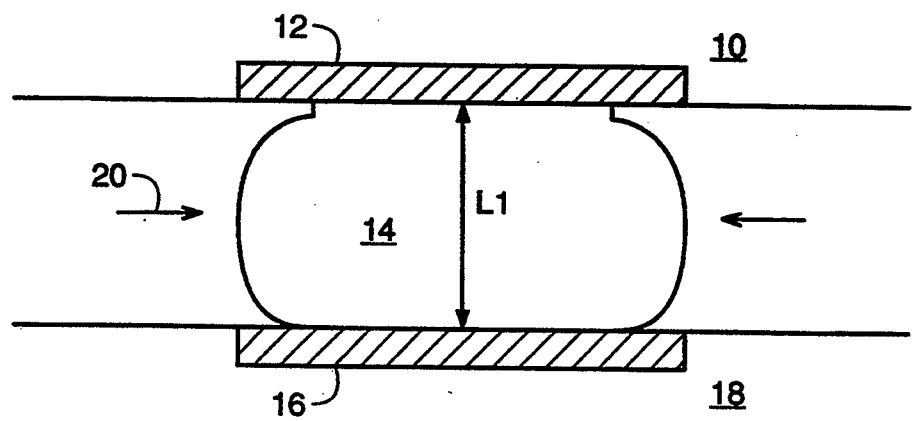
FIG. 1 is a cross-sectional close-up view of a ball grid array bond attaching an IC device to a PCB under standard atmospheric pressure.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings, specification, and claims. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arms" (Article 1, Section 8 of the U.S. Constitution).

General Embodiment

FIG. 1 is a related art cross-sectional close-up view of a ball grid array bond attaching an IC device to a PCB under standard atmospheric pressure, having the following elements: There is an IC 10 that has been BGA with solder balls 14 onto the bonding pads 12. The solder ball 14 is heated and pressed onto the PCB 18 at the assigned bond pad 16. Once the solder is liquefied enough, the stand off distance L1 is increased to the standard 0.025 inches.

Figure 2:
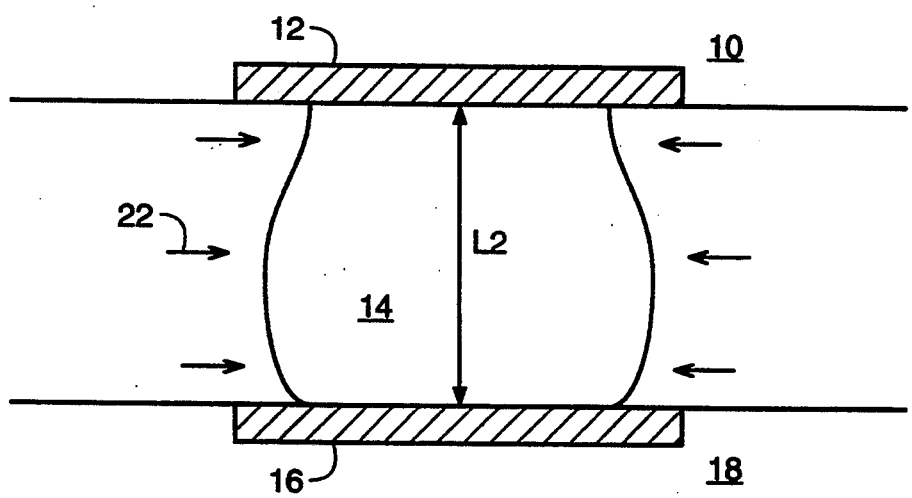
FIG. 2 is a cross-sectional close-up view of a ball grid array bond attaching an IC device to a PCB under higher than standard atmospheric pressure.

FIG. 2 is a cross-sectional close-up view of a ball grid array bond attaching an IC device to a PCB under higher than standard atmospheric pressure, having the same elements as in FIG. 1, with the additional following elements: As illustrated by elevating the pressure applied 22 onto the side walls of the ball bond 14, the stand off distance can be increased to L2, and the resulting side wall configuration becomes more vertical.

Remarks about the Invention

It is noted that by applying pressure to the side walls of the ball bond, the walls will resist sagging and be able to stand more upright. With the upright configuration, experimental evidence performed on other soldering situations demonstrated that the bond sight would last longer and not fracture as easily. Depending upon the amount of elevated pressure applied to the side walls, the walls will come closer to the ideal of a perfect column, or vertical walls. Thus, achieving the desired increase of longevity and better electrical current characteristics.

Variations in the Invention

There are several obvious variations to the broad invention and thus come within the scope of the present invention. It is noted that there are many ways to create a higher pressure around the ball bonding grid arrays. For example, by enclosing the ICs into a solder heating device, excess air pressure can be pumped into the chamber. This of course would require many PCBs to be loaded at one time into the solder heating device in order to keep pace with anticipated assembly line flows. Any type of solder is usable with this invention.

Elevated pressure soldering can effectively change the shape of the solder connection to the other surface mounted devices including discrete chip components and LCCs (leadless chip carrier), both using solder paste.

Other gasses may be used to elevate the atmospheric pressure on the solder bond including nitrogen, carbon dioxide, and others.

This invention also contemplates the developing miniaturization of IC bonding technology. Specifically, in the future, the achievement of approximate parallel solder ball walls will require even smaller stand off heights; of 100% or more shrinkage from the current 0.025 inches.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States Patent is:

1. A method of bonding Ball Grid Array (BGA) soldered ICs, comprising the steps of:
   a) providing a BGA soldered IC;
   b) providing an appropriate PCB;
   c) pressing the IC, at an appropriate location, onto the PCB;
   d) heating the PCB and IC arrangement;
   e) applying an atmospheric pressure above standard atmospheric pressure;
   f) pulling the IC away from the PCB a distance greater than 0.025 inches; and
   g) solidifying the solder bond between the IC and PCB.

2. A method of bonding ICs to a PCB, comprising:
   providing an IC that has been BGA soldered;
   pressing the IC onto the PCB at an appropriate location;
   heating the solder until it is softened and adheres to both the IC and PCB;
   increasing atmospheric pressure around the solder; causing the stand off distance to be greater than 0.025 inches; and
   solidifying the solder.

3. A method of bonding ICs to PCB, comprising the steps of:
   a) providing a soldered IC;
   b) providing an appropriate PCB;
   c) pressing the IC, at an appropriate location, onto the PCB;
   d) heating the PCB and IC arrangement;
   e) applying an atmospheric pressure above standard atmospheric pressure;
   f) pulling the IC away from the PCB a distance greater than what can be achieved under standard atmospheric pressure conditions; and
   g) solidifying the solder bond between the IC and PCB.

4. A method of bonding ICs to a PCB, comprising:
   providing an IC that has been soldered;
   pressing the IC onto the PCB at an appropriate location;
   heating the solder until it is softened and adheres to both the IC and PCB;
   increasing atmospheric pressure around the solder;
   causing the stand off distance to be greater than what can be achieved under standard atmospheric pressure conditions; and
   solidifying the solder.

* * * * *